United States Patent [19]
Nielson

[11] 4,383,208
[45] May 10, 1983

[54] DYNAMIC DETERMINATION OF FRICTION IN A CLOSED LOOP CONTROL SYSTEM

[75] Inventor: Marlin C. Nielson, Boulder County, Colo.

[73] Assignee: International Business Machines Corporation, Armonk, N.Y.

[21] Appl. No.: 313,125

[22] Filed: Oct. 20, 1981

Related U.S. Application Data

[63] Continuation-in-part of Ser. No. 108,738, Dec. 31, 1979.

[51] Int. Cl.³ .............................................. G05B 5/01
[52] U.S. Cl. .................................. 318/618; 318/490; 318/638; 318/601
[58] Field of Search ............... 318/618, 326, 332, 616, 318/309, 332, 617, 601, 638, 490

[56] References Cited

U.S. PATENT DOCUMENTS

| | | | |
|---|---|---|---|
| 2,549,022 | 4/1951 | Shenk et al. | 324/76 A |
| 3,122,687 | 2/1964 | Romvari | 318/618 |
| 3,657,623 | 4/1972 | Fludzinski | 318/326 |
| 3,780,364 | 12/1973 | Henderson | 318/326 X |
| 3,839,628 | 10/1974 | Higgins et al. | 235/151.3 |
| 3,916,279 | 10/1975 | Kawano et al. | 318/430 |
| 4,019,107 | 4/1977 | Dixon et al. | 318/332 |
| 4,215,298 | 7/1982 | Bigley et al. | 318/618 X |

OTHER PUBLICATIONS

IBM Technical Disclosure Bulletin, vol. 17, No. 1, Jun. 1974, "Meter Speed Control", by D. E. Popp.

*Primary Examiner*—Ulysses Weldon
*Attorney, Agent, or Firm*—Joscelyn G. Cockburn; Earl C. Hancock

[57] ABSTRACT

A novel method and apparatus for dynamically monitoring the friction associated with an electromechanical system including a motor. The apparatus includes a closed loop servo with a unique filtering means in the feed forward loop for controlling the phase and magnitude of a "digital" ramp function used to drive the electromechanical system. The value of the filtered error signal outputted from the filtering means correlates with the friction in said electromechanical system.

7 Claims, 4 Drawing Figures

4,383,208

DYNAMIC DETERMINATION OF FRICTION IN A CLOSED LOOP CONTROL SYSTEM

RELATED APPLICATIONS

This application is a continuation-in-part of copending application Ser. No. 108,738 filed Dec. 31, 1979.

BACKGROUND OF THE INVENTION

1. Field of the Invention

This invention relates to an improved method and apparatus for monitoring the performance of electromechanical systems driven by electric motors, and more particularly, relates to the measuring of friction associated with said systems.

2. Description of Prior Art

The use of motors for driving electromechanical systems, such as machines for transporting load or weight, paper feed devices, etc. are well known in the prior art. Generally the motors are servocontrolled so that precise motion is transmitted to the load. The input energy to the motor should be of a sufficient magnitude which will overcome the frictional force associated with the system, and at the same time, perform useful work such as transporting a load. Knowing the frictional force associated with a particular system will enable the optimization of power needed to drive a particular system to overcome the frictional force.

The frictional force associated with a system can be used to predict impendent failure mode in the system. For example, if the bearings in a system are beginning to wear, then by monitoring the change in the friction, one can change the bearing prior to a complete breakdown of the system.

In view of the above, there is a clear need for a device which is able to accurately measure the friction associated with a motor and/or electromechanical system. Moreover, the measuring device should be able to measure friction dynamically. As such, as the frictional characteristics of a system change due to age, worn parts, etc., the calculated value will be more accurate. The calculated value can be used for antifriction compensation or for maintaining reliability, serviceability and availability (RAS) for the system.

The effect of friction on an electromechanical system is exemplified in U.S. Pat. No. 3,916,279. In that system a controlled motor is used for lifting a load coupled through a pulley onto the shaft of the motor. A friction-simulating circuit generates a signal which compensates for the friction associated with the system. The design of the simulating circuit is based on a statistical prediction of the friction. Any deviation from the predicted value reduces the effectiveness of the circuit.

SUMMARY OF THE INVENTION

It is therefore the object of the present invention to provide a means for measuring the friction associated with an electromechanical system.

It is another object of the present invention to log the friction value and to cause the same as a diagnostic tool.

In accordance with the present invention, an electromechanical system including a motor is driven by a "step-up" ramp function or "digital" ramp function. A measuring device such as a two-phase tachometer is positioned on the shaft of the motor. The tachometer, in combination with a counter, generates a position signal which is fed back and summed with the "step-up" or "digital" ramp function to produce an error signal. A filtering means controls the phase and amplitude of the error signal and outputs a signal having a value proportional to the friction at steady state.

In one feature of the invention the frictional value is logged and the logged value is compared with a present value to determine any change in the friction. If the change exceeds a predetermined value, then a warning is issued.

The foregoing and other objects, features and advantages of the invention will be apparent from the following more particular description of the preferred embodiment of the invention, as illustrated in the accompanying drawings.

DETAILED DESCRIPTION OF THE PREFERRED EMBODIMENT

Figure 3:
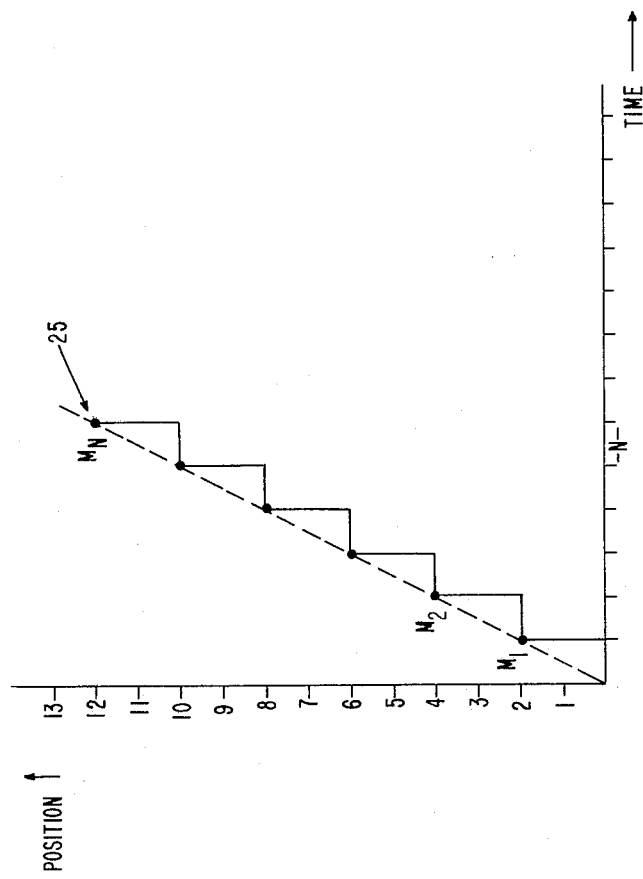
FIG. 3 shows a plot of the step-up ramp function or the digital ramp function used to drive the electromechanical system.

As is used in the specification, the terminology "step-up" ramp function or "digital" ramp function means an electrical signal having a plurality of discrete points disposed along a line which mimics a conventional analog ramp function as is shown in FIG. 3. The function in FIG. 3 can also be described as a "staircase" type function.

Figure 1:
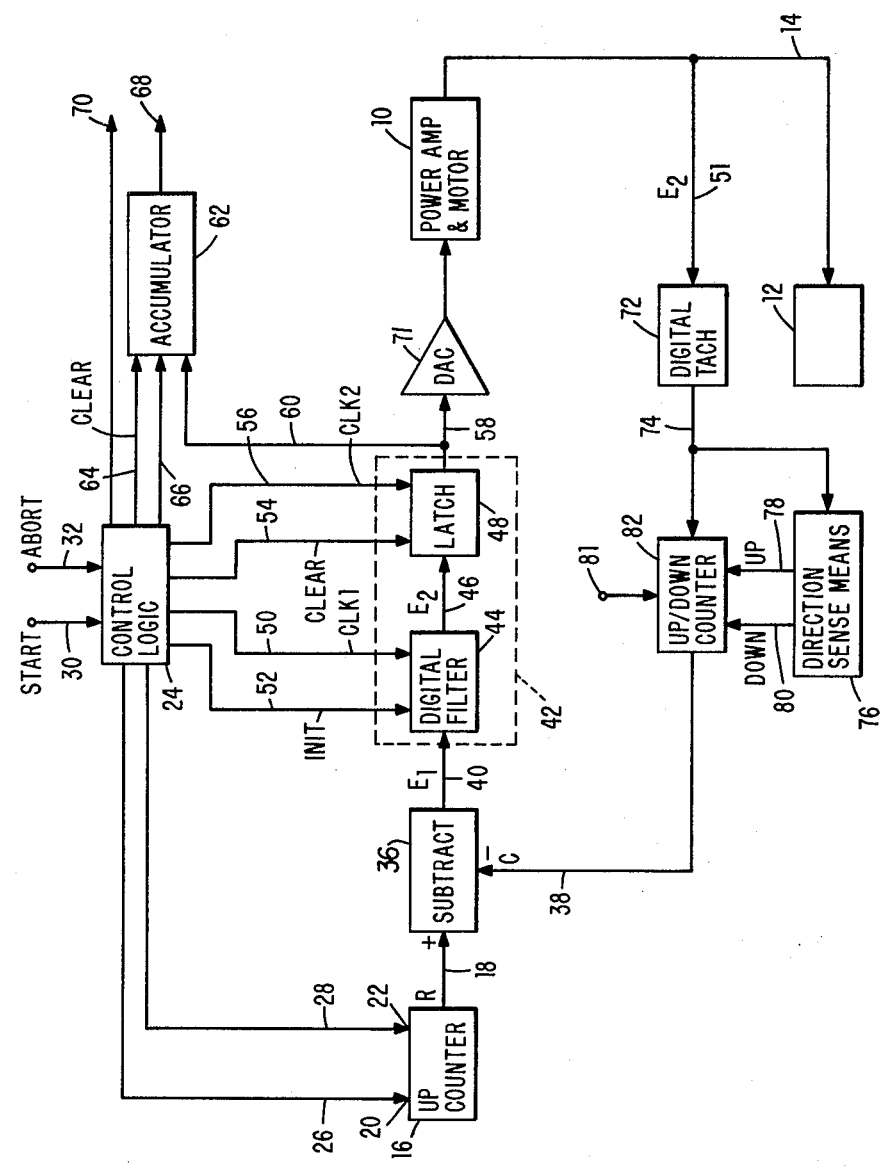
FIG. 1 shows a block diagram of an electromechanical system, including a motor and control loop in accordance with the teachings of the present invention.

Referring now to FIG. 1, an electrical drive system 10 is operatively coupled to a machine or process indicated by block 12. The machine or process can be any machine or process known in the art, such as a feed-through scanner. The electrical drive system 10 includes a motor operatively coupled to a power amplifier. The power amplifier supplies the necessary electrical energy which is necessary to drive the motor so as to effectuate the necessary motion in the machine 12. By way of example, if machine 12 is a paper feed mechanism, the output shaft from the motor is coupled through a gear-reducing mechanism (not shown) which drives the paper through the machine. It is worthwhile noting that although the system described hereinafter will be a digital system, this should be construed as exemplary, since it is within the skill of the art to convert the digital system into an analog system without departing from the scope of the present invention.

Still referring to FIG. 1, lead 14 couples the machine to the electrical drive system 10. In this type of system, the friction which is present in the machine and the electrical drive system is critical to the proper operation of the system. This being the case, the invention described hereinafter measures the friction associated with the system. It should also be noted that the invention to be described will measure the friction associated with the electrical drive system 10, and in particular, the motor if a machine such as 12 is not coupled to the motor shaft. In this application the invention is useful for measuring friction associated with a motor on a motor production line.

Still referring to FIG. 1, a signal-generating means 16 generates a feed forward control signal R on conductor 18. The feed forward control signal R is a positional signal whose magnitude is such that when it is processed by the elements in the feed forward loop of the system and applied to the motor, the shaft of the motor rotates at a predetermined velocity. The signal-generating means 16 is a 16-bit UP counter having two controlled inputs 20 and 22, respectively. The controlled inputs accept control signals outputted from control logic means 24 on conductor 26 and 28, respectively. The signal on conductor 26 initializes the counter so that the output control signal R=0. The successive time dependent signals on conductor 28 step the counter. This being the case, the output signal is, in effect, a "digital" ramp function as is shown in FIG. 3.

Before describing the details of control logic means 24, the output control signal R will be described. In the preferred embodiment of the invention, the control signal R is a "digital" ramp signal. FIG. 3 shows a plot of the "digital" ramp signal. The plot is helpful in understanding the characteristics of the input signal which drives the electromechanical system to enable the measurement of friction. Time is represented on the horizontal axis of the plot while position is represented on the vertical axis. As can be seen from the graph, every "N" unit of time the motor is driven to more "z" units of position. In the preferred embodiment of the present invention z=2.

As such, the signal 25 which drives the motor may also be characterized as a "step" type function. The "step" type function is called a "digital" ramp function or a "step-up" ramp function. The points identified by $M_1$, $M_2$ and $M_N$ represent the effective points on the "digital" ramp. The effective points represent the frequency of pulses on conductor 18 (FIG. 1). It should be noted that when the points $M_1$, $M_2$ and $M_N$ are joined by a straight line, such as the broken line in the figure, the broken line represents the traditional or conventional "analog" ramp function.

In the preferred embodiment of this invention the "digital" ramp function is generated by a conventional microprocessor and a conventional UP counter. To this end, the control logic means 24 (FIG. 1) is the conventional microprocessor and the UP counter 16 is driven by the microprocessor. Any conventional microprocessor can be utilized as the control logic means 24. By way of example, the Motorola 6800 microcomputer is suitable. The microprocessor has a known instruction set and it is within the ordinary skill of one skilled in the programming art to program the microcomputer to drive the UP counter to generate the discrete electrical signals identified by numeral 25 (FIG. 3). As such, details of the programming technique will not be given. Suffice it to say that one of the residence counters in the microprocessor is stepped by a constant frequency clock. At specific time intervals, control pulses are outputted from the microcomputer on conductor 28. The pulses step the UP counter 16. The output from the UP counter is the series of discrete signals identified by numeral 25 in FIG. 3.

Figure 4:
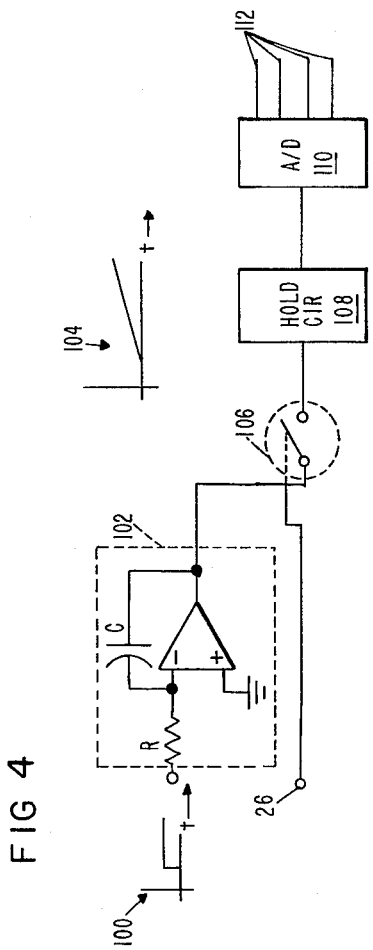
FIG. 4 shows an alternate circuit for generating the step-up ramp function or the digital ramp function.

Of course, there are other ways of generating a "digital" ramp function without departing from the scope of the present invention. With reference to FIG. 4, to step function 100 is applied to the analog-generating circuit means 102. An analog ramp signal 104 is generated by the analog-generating circuit means. The analog ramp signal 104 is fed into a sampling circuit means 106. In the preferred embodiment, the sampling circuit means is an electronic switch. The frequency of sampling (that is closing of the switch) is controlled by a set of signals on conductor 26. The signals on conductor 26 are generated by the previously described microcomputer. The output from sampling circuit means 106 is stored in hold circuit (CIR) 108. The output from the hold circuit is digitized by A/D converter 110 and is outputted on conductors 112. Alternately, the control logic means 24 may be a series of conventional combinatorial logic. The logic is designed to output control signals at predetermined periods of time. The control logic means 24 is governed by two input signals on conductors 30 and 32, respectively. The signal on conductor 30 is a start signal which enables the control logic means 24. Likewise, the signal on conductor 32 deactivates or stops the control logic means 24 from functioning. Both signals can be generated from switches, etc. As was state previously, a "digital" ramp positional signal R is generated by signal-generating means 16 and control logic means 24. The signal is outputted on conductor 18. The signal is fed into summing means 36. As will be explained hereinafter, the positional signal is algebraically summed with a feedback positional signal generated on conductor 38 and outputs an error signal $E_1$ on conductor 40.

Algebraically stated:

$$E_1 = R - C$$

where:

R = the "digital" ramp positional signal
C = the feedback velocity signal

In the preferred embodiment of this invention, the summing means 36 is a 16-bit subtractor. The error signal $E_1$ on conductor 40 is next fed into digital filtering means 42. The digital filtering means 42, details of which will be given hereinafter, includes a 16-bit digital filter 44 whose output $E_2$ is fed over conductor 46 into an 8-bit latch means 48. The digital filter 42 controls the amplitude and the phase of generated error signal $E_1$ so that the output error value $E_2$ gives a value which is equivalent to the friction in the motor and/or machine 12. The digital filter 44 is controlled by a first clock, hereinafter called CLK1 signal on conductor 50 and an initialization (INIT) signal on conductor 52. Both signals are generated from control logic means 24. As stated before, the control logic means 24 is a conventional microcomputer program to generate timing pulses at particular intervals of time. Similarly, a clear signal on conductor 54 clears latch 48 while a control clock signal, hereinafter called CLK2, on conductor 56 transfers the signal on conductor 46 into the latch.

The error value is best representative of the true friction in the motor when the value is achieved with the motor running at steady state. As such, the frictional error value on conductor 58 is fed over conductor 60 into a storage means or accumulator 62. The accumulator 62 allows the frictional value to be averaged over a predetermined number of machine cycles. The control signals to accumulator 62 are generated by control logic means 24 over conductors 64 and 66, respectively. By way of example, the signal on conductor 64 clears the contents of the accumulator, while the signal on conductor 66 enables the accumulator to receive data from conductor 60. The output from the accumulator is given on conductor 68 and represents the friction associated with the electromechanical system which includes the electrical drive system 10 and/or machine 12. As will be described hereinafter, the frictional value on conductor 68 may be logged into a permanent log or memory under the control of a control pulse on conductor 70.

Still referring to FIG. 1, the error signal E₂ which is outputted on conductor 46 is converted by a conventional digital-to-analog converter (DAC) 71 and is used for driving the motor 10. As was stated previously, the positional signal R tends to rotate the motor shaft. As the shaft of the motor begins to rotate, a measuring means 72 measures the velocity of the rotating shaft. In the preferred embodiment of this invention, the measuring means 72 is a two-phase digital tachometer coupled to the shaft of the motor. The digital tachometer measures both velocity and direction of rotation. The use of a digital tachometer for measuring velocity and/or direction of rotation is well known in the art, therefore, the details of such a tachometer will not be described. Suffice it to say that the tachometer provides two 90° phase-shifted output signals which are merged in a utilization circuit to output direction and velocity signals on conductor 74. The direction of motor rotation is sensed by direction sensor means 76. The direction sensor means 76 generates an UP signal on conductor 78 or a DOWN signal on conductor 80. The signal on conductors 78 and 80, respectively, forces the UP-DOWN counting means 82 to count upwards or downwards depending on the direction of the rotation of the motor shaft, thus effectively integrating the tachometer output to produce a positional output. The output from the UP-DOWN counter is outputted on conductor 38 and is the feedback signal which is algebraically summed with the feed forward positional signal. Initialization of the UP-DOWN counter is achieved by a signal on conductor 81 which is generated from the control logic means 24.

Figure 2:
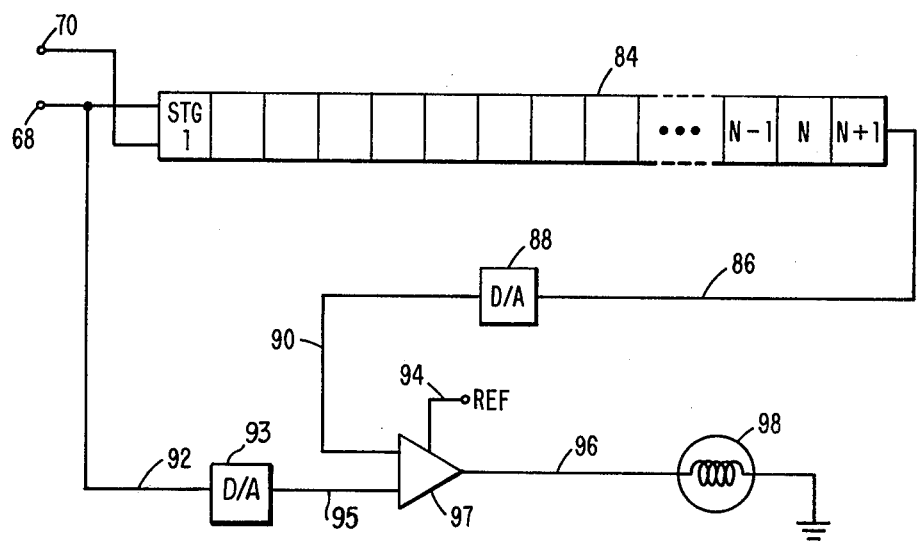
FIG. 2 shows a logging system suitable for use with FIG. 1 to indicate excessive friction in the system.

Referring now to FIG. 2, a logging system suitable for using the frictional values generated on conductor 68 is shown. However, these error values may be stored simultaneously in the permanent memory of a computer as part of an error routine and is printed out so that it can be reviewed as part of the reliability, serviceability and availability (RAS) routine. Also, the error values can be used to inform an operator of the increase in friction when it surpasses a predetermined value. To this end, the frictional value outputted from accumulator 62 on conductor 68 is placed into stage one (STG1) of a multistage shift register 84. Entry of data into the shift register and/or sequential shifting of data from one stage to the next, is controlled by clock pulses outputted from control logic means 24 on conductor 70. The system is configured so that controlled pulses on conductor 70 force the shift register to shift one position to the right. As such, the information which was first placed in stage one of the shift register after a number of shifts, is now present in stage (N+1) of the register. With one of the shifts, the information in stage (N+1) is fed over conductor 86 into digital-to-analog (D/A) converter 88. The digital-to-analog convertor converts the digital signal into an analog signal and outputs the same on conductor 90. The signal on conductor 90 is compared with a present signal on conductor 95 to output a signal on conductor 96 when the difference between the signals on conductors 90 and 95, respectively, exceed a predetermined reference signal on terminal 94 of comparator means 97. It should be noted that the signal on conductor 92 is converted by digital-to-analog (D/A) converter 93 before it is fed into comparator means 97. In the preferred embodiment of the present invention, the comparator means 97 is an operational amplifier with a reference terminal 94 which is used to connect the referenced voltage. Whenever the difference between the value on conductor 90 and conductor 95 exceeds that reference, a voltage pulse is outputted on conductor 96. Conductor 96 is operatively coupled to a lamp 98. The signal on conductor 96 illuminates the filament of the lamp and, as such, warns an operator when the friction in the system exceeds a tolerable value.

It is worthwhile noting that the comparison in the comparator is done between the last stage of the shift register and a present value generated. This means that the last read frictional value is always compared with a present frictional value to indicate whether or not the frictional value in the system is running at an accepted level. A comparison against a constant value could also be used to signal that the friction has surpassed some present value.

The use of a controlled closed-loop servo to extract friction values associated with a motor and/or motor-driven system may be explained mathematically. The below-described methematical model describes a specific example. Of course, the teaching may be used to extend to any type of controlled closed-loop servo system.

In the mathematical description, let Z(G(S)) mean the Z-transform of G(S). G(Z) is the Z-transform of the Inverse Laplace Transform.

In any electromechanical drive system such as the system described above, at least three types of friction forces are present:

1. Static Friction ($\tau_s$) (Striction): Static friction, sometimes called starting friction, is the resistance to movement at zero velocity.

2. Coulomb Friction ($\tau_F$): Coulomb friction has a constant value for all velocity values of the same sign.

3. Viscous Friction ($\tau_B$): Viscous friction is a linear function of the velocity.

The combination of the coulomb and viscous friction torques forms a nonlinear function which does not have a closed form Laplace transform representation. However, if the value of the radian velocity does not change sign or vanish for a particular input and time interval, then the coulomb friction torque appears as a constant torque function which has a closed form Laplace transform. As is expected, the nonlinear aspect of the coulomb friction leads to nonlinear behavior of the control system about zero velocity.

A dynamic equation for an electromechanical drive system with friction is as follows:

$$Ki - \tau_F = J\frac{d\omega}{dt} + B\omega \qquad \text{Equation 1}$$

where:
K = motor torque constant
$\tau_F$ = coulomb friction torque
J = moment of inertia of motor and load
B = viscous friction
$\omega$ = angular velocity of the motor
i = motor armature current The Laplace transform of equation 1 with zero initial conditions is:

$$KI(s) - \frac{TF}{S} = (Js + B)W(s)$$

where $I(s)$ and $W(s)$ are the Laplace transforms of the motor current and angular velocity respectively. The system transfer function is then:

$$W(s) = \frac{KI(s)}{Js + B} - \frac{\tau_F}{s(Js + B)} \quad \text{(Equation 2)}$$

First, viscous friction at steady state will be investigated by setting the coulomb friction torque to zero and taking the Z-transform of the system:

$$E_2(z) = \frac{D(z)R(z)}{1 + D(z)HG(z)}$$

where:

The notation $HG(z)$ means $z(H(s)G(s))$, and in general does not equal $H(z)G(z)$ which means $z(H(s))$ times $z(G(s))$. The steady state error signal $e_2(\infty) =$ limit as t approaches infinity $e(t)$, and by the final value theorem:

$$e_2(\infty) = \lim_{z \to 1} \frac{z-1}{z} E_2(z)$$

$$= \lim_{z \to 1} \frac{z-1}{z} \frac{D(z)R(z)}{1 + D(z)HG(z)}$$

$$= \lim_{z \to 1} \frac{z-1}{z} \frac{R(z)}{\frac{1}{D(z)} + HG(z)}$$

If the limit as z approaches 1 of $1/D(z)$ equals zero, then we could eliminate parameters of $D(z)$ from the limit.

$$D(z) = 10 \cdot 2 \left[ \frac{z^2 - 1.82 + 0.82}{(z-1)(z+0.82)} \right]$$

which is unbounded when z approaches 1, thus allowing us to eliminate $1/D(z)$ from the limit. Therefore, using the $D(z)$:

$$e_2(\infty) = \lim_{z \to 1} \frac{z-1}{z} \frac{R(z)}{HG(z)}$$

It can be shown that the transfer function for the zero order hold and second order plant is:

$$HG(z) = \frac{AK}{B^2} \frac{BT(z - \exp(-bt)) - J(z-1)(z - \exp(-bt)) - J(z-1)^2}{(z-1)(z - \exp(-bt))}$$

where b is the mechanical time constant $(B/J)$ and T is the sampling interval in seconds. Next by taking the limit of the last two terms in the numberator as z approaches 1:

$$HG'(z) = \frac{AK}{B} \frac{T}{z-1}$$

Finally, $$e_2(\infty) = \lim_{z \to 1} \frac{z-1}{z} \frac{R(z)}{HG'(z)} =$$

$$\frac{(z-1)^2}{zT} \frac{B}{AK} R(z) = \frac{(z-1)^2}{zT} \frac{B}{AK} R(z)$$

By choosing $R(z) = \frac{zT}{(z-1)^2} (r_o)$ which happens to be the z-transform of the ramp forcing function of amplitude $r_o$, we get:

$$e_2(\infty) = \frac{B}{AK} (r_o)$$

This says that by driving the control system with a ramp (velocity) input of $r_o$ and observing the steady state error signal, $e_2(\infty)$, we can measure a value proportional to B, the viscous friction.

The total friction at steady state will now be determined. Now we can consider the case where the coulomb friction torque, $\tau_F$, does not equal zero. As stated earlier, the coulomb friction appears as a constant torque for angular velocities either positive or negative and never crossing the zero velocity point. Taking the Z-transform of the system:

$$E_2(z) = \frac{D(z)R(z)}{1 + D(z)HG(z)} + \frac{D(z)\tau_F G(z)}{1 + D(z)HG(z)}$$

Where $\tau = \tau(z)$, the friction torque, and $\tau G(z) = Z(\tau(s)G(s))$ as explained earlier. Again by applying the final value theorem on $e_2(t)$ and using the result of the previous section:

$$e_2(\infty) = \lim_{z \to 1} \frac{z-1}{z} E_2(z) = \frac{B(r_o)}{AK} +$$

$$\lim_{z \to 1} \frac{z-1}{z} \frac{D(z)\tau_F G(z)}{1 + D(z)HG(z)} = \frac{B(r_o)}{AK} +$$

$$\lim_{z \to 1} \frac{z-1}{z} \frac{\tau_F G(z)}{HG(z)}$$

It can be shown that where $\tau_F$ is a unit step function with an amplitude $\tau/K$:

$$TG(z) = \frac{\tau}{AK} \frac{z}{z-1} HG(z) \quad \text{Equation 3}$$

Therefore, $$e_2(\infty) = \frac{B(r_o) + \tau}{AK}$$

This result extends the result of the previous section. It says that by driving discrete time system with a ramp input, we can obtain a value proportional to the total system friction. Both proportionality constants, A and K, are gain terms (amplifier gain and motor torque constant respectively).

If desired, the values of B and $\tau$ can be determined by using two distinct velocities of the same sign, say r and p. If the steady state errors measured at the two velocities are e and $\epsilon$ respectively, then:

$$e = \frac{Br + \tau}{AK} \quad ; \quad \epsilon = \frac{Bp + \tau}{AK} \qquad \text{Equation 4}$$

Subtracting $\epsilon$ from $e$ in Equation 4 yields:

$$e - \epsilon = \frac{B(r - p)}{AK} \qquad \text{Equation 5}$$

Solving Equation 5 for the viscous friction, B yields:

$$B = AK \frac{e - \epsilon}{r - p} \qquad \text{Equation 6}$$

Substituting the result of Equation 6 into the first member of Equation 4 yields the result for the coulomb friction:

$$\tau = AK \left( e - r \frac{e - \epsilon}{r - p} \right)$$

As was stated previously, the error $E_1$ on conductor 40 (FIG. 1) is modified by filter 44 to output a signal on conductor 46. The signal on conductor 46 is proportional to the friction in the system. In the preferred embodiment of the present invention a digital filter is used. A mathematical expression for the digital filter or compensator is as follows:

$$D(z) = \frac{10.2z^2 - 18.45z + 8.4}{z^2 - 0.1818z - 0.8182} \qquad \text{Equation 7}$$

Equation 7 is the complete compensator for the position control system. To implement D(z) in a conventional processor, it must be converted to a difference equation in the time domain. If the input to the compensator is $E_1(z)$ and the output is $E_2(z)$, then:

$$D(z) = \frac{E_2(z)}{E_1(z)} = \frac{10.2z^2 - 18.45z + 8.4}{z^2 - 0.1818z - 0.8182} \qquad \text{Equation 8}$$

After multiplying the numerator and denominator by $1/z^2$, Equation 8 becomes:

$$\frac{E_2(z)}{E_1(z)} = \frac{10.2 - 18.45/z + 8.4/z^2}{1 - 0.1818/z - 0.8182/z^2} \qquad \text{Equation 9}$$

After cross multiplying, Equation 9 becomes:

$$E_2(z) - 0.1818 E_2(z)/z - 0.8182 E_2(z)/z^2 = 10.2 E_1(z) - 18.45 E_1(z)/z + 8.4 E_2(z)/z^2 \qquad \text{Equation 10}$$

Finally, after taking the inverse Z-transform, Equation 10 becomes:

$$10.2e_1(n) - 18.45e_1(n-1) + 8.4e_1(n-2)$$
$$e_2(n) - 0.1818e_2(n-1) - 0.8182e_2(n-2) \qquad \text{Equation 11}$$

Since the desired result is the output at the current sample time, namely $e_2(n)$:

$$e_2(n) = 10.2e_1(n) - 18.45e_1(n-1) + 8.4e_1(n-2) + 0.1818e_2(n-1) + 0.8182e_2(n-2) \qquad \text{Equation 12}$$

Equation 12 is in a form that can be realized using a conventional processor or microcomputer. The equation says that the error output at a sample time is the linear combination of the error input at the current sample time, the error inputs at the two previous sample times, and the error outputs at the two previous sample times.

The above apparatus and method allows one to accurately determine the friction in an electromechanical system such as a paper drive system (the controlled plant). The friction value requires adaptive determination because its value will vary from one machine to another as well as with time for any one machine. Knowledge of the friction in the controlled plant will have the following beneficial consequences:

The processor or controller can save the friction value in nonvolatile storage or send the value to the host for diagnostic purposes. An erratic or unusually large friction value would indicate a possible problem with the scanner drive system.

An accurate friction value could minimize transients in a phase locked velocity control when it switches from open loop acceleration to closed loop velocity control. The friction value determines the amount of bias applied to the phase locked loop.

The friction value, again applied as a bias, will minimize the velocity ripple in the phase locked loop velocity control under steady state conditions by cancelling the average friction torque in the scanner drive system.

While the invention has been particularly shown and described with reference to a preferred embodiment thereof, it will be understood by those skilled in the art that various changes in form and details may be made therein without departing from the spirit and scope of the invention.

What is claimed is:

1. Device for dynamically measuring the friction associated with an electromechanical system comprising in combination:

an electromechanical system including a motor;

controller means operable to generate a controlled input signal for driving said motor;

means disposed in a feedback loop operable for monitoring the output of said motor and for generating a feedback signal;

means for receiving the controlled signal and the feedback signal and to generate an error signal therefrom; and digital filtering means for receiving the error signal and operable to control the phase and magnitude of said error signal, said digital filtering means having a filter being characterized by the mathematical expression:

$$D(z) = \frac{z}{z - 1} \left( 10.2 \frac{z^2 - 1.8z + 0.82}{z(z + 0.81)} \right)$$

Wherein:

D(z) represents the transfer function of the filter, z/(z−1) represents a discrete integrator, $$\left( 10.2 \frac{z^2 - 1.8z + 0.82}{z(z + 0.81)} \right)$$

represents the stabilizing factor for the feedback loop; and a latch circuit disposed between the digital filtering means and the electromechanical system, said latch circuit being operable to store a signal outputted from the filtering means.

2. The device of claim 1 further including means for accepting the signal outputted from the filtering means and to generate an average value signal representative of the friction taken over a predetermined period of time.

3. The device of claim 2 further including means for accepting and for logging the average value signal;

means for comparing the logged average value signal with a present average value signal with the present average value signal being representative of an instantaneous friction associated with the electromechanical system; and means for indicating when a present average value signal exceeds a logged average value signal.

4. Method for monitoring the friction associated with an electromechanical system including a motor, comprising the following steps:

generating a "digital" ramp input signal;

applying the "digital" ramp input signal to the motor;

monitoring the output of the motor and generating a feedback signal;

algebraically summing the "digital" ramp input signal and the feedback signal to generate an error signal; and filtering the error signal with a filter circuit having at least one pole at the origin of its transfer function to output a drive signal whose value represents the friction associated with said electromechanical system.

5. The method of claim 4 further including the steps of averaging the drive signal when said drive signal is at steady state;

storing the average drive signal;

comparing the stored average drive signal with a present average signal to generate an error signal with the present average signal being representative of an instantaneous friction associated with the electromechanical system; and utilizing said error signal for predicting the reliability, availability and serviceability of said electromechanical systems.

6. The device of claim 1 wherein the controlled input signal is a "digital" ramp function.

7. Device for dynamically measuring the friction associated with an electromechanical system comprising in combination:

an electromechanical system including a motor;

controller means coupled to the electromechanical system, said controller means being operable to generate a "digital" ramp input signal for driving said motor;

means operable for monitoring the output of said motor and for generating a feedback signal;

means for receiving the "digital" ramp signal and the feedback signal and to generate an error signal therefrom; and a digital filtering means, including a digital filter and a latching circuit, operable to receive the error signal and operable to control the phase and magnitude of said error signal so that the output signal from said filtering means correlates with friction associated with said electromechanical system.

* * * * *